(12) United States Patent
Kwok et al.

(10) Patent No.: US 7,790,580 B2
(45) Date of Patent: Sep. 7, 2010

(54) METAL-INDUCED CRYSTALLIZATION OF AMORPHOUS SILICON IN THIN FILM TRANSISTORS

(75) Inventors: Hoi Sing Kwok, Kowloon (HK); Man Wong, New Territories (HK); Zhiguo Meng, New Territories (HK); Shuyun Zhao, Kowloon (HK); Chunya Wu, Kowloon (HK)

(73) Assignee: Hong Kong University of Science and Technology, Hong Kong (HK)

( * ) Notice: Subject to any disclaimer, the term of this patent is extended or adjusted under 35 U.S.C. 154(b) by 562 days.

(21) Appl. No.: 11/684,447

(22) Filed: Mar. 9, 2007

(65) Prior Publication Data

US 2007/0212855 A1    Sep. 13, 2007

Related U.S. Application Data

(60) Provisional application No. 60/781,496, filed on Mar. 13, 2006, provisional application No. 60/838,807, filed on Aug. 18, 2006.

(51) Int. Cl.
*H01L 21/20* (2006.01)
*H01L 21/36* (2006.01)

(52) U.S. Cl. ............... 438/478; 257/576; 257/E21.412; 257/E23.164

(58) Field of Classification Search ............ 438/96, 438/97, 478, 368; 257/518, 557, 576, 756, 257/E21.412, E23.164
See application file for complete search history.

(56) References Cited

U.S. PATENT DOCUMENTS

| 5,654,203 | A | * | 8/1997 | Ohtani et al. ........... 438/97 |
| 5,705,829 | A | | 1/1998 | Miyanaga et al. |
| 5,843,833 | A | * | 12/1998 | Ohtani et al. ........... 438/486 |
| 6,242,779 | B1 | | 6/2001 | Maekawa |
| 6,338,991 | B1 | | 1/2002 | Zhang et al. |
| 6,737,674 | B2 | | 5/2004 | Zhang et al. |
| 2003/0129853 | A1 | | 7/2003 | Nakajima et al. |

\* cited by examiner

*Primary Examiner*—Davienne Monbleau
*Assistant Examiner*—Monica D Harrison
(74) *Attorney, Agent, or Firm*—Robert D. Katz, Esq.; Cooper & Dunham LLP

(57) ABSTRACT

The invention provides a method for forming thin film transistors including a polycrystalline semiconducting film. The method comprises depositing a first layer of amorphous semiconducting thin film on to a substrate; depositing a second layer of thin film on to the first layer of amorphous semiconducting thin film; patterning the second layer of thin film so that the first layer of amorphous semiconducting thin film is exposed at selected locations; exposing the first and second layers of thin film to a nickel containing compound in either a solution or a vapor phase; removing the second layer of thin film; and annealing the first layer of amorphous semiconducting thin film at an elevated temperature so the first layer of amorphous semiconducting thin film converts into a polycrystalline semiconducting thin film.

25 Claims, 10 Drawing Sheets

METAL-INDUCED CRYSTALLIZATION OF AMORPHOUS SILICON IN THIN FILM TRANSISTORS

This application claims priority of U.S. Provisional Patent Application No. 60/781,496, filed Mar. 13, 2006 and U.S. Provisional Patent Application No. 60/838,807, filed on Aug. 18, 2006. The entire contents of these applications are incorporated herein by reference.

FIELD OF THE INVENTION

The present invention relates to thin film transistors using low temperature polycrystalline silicon. In particular, the invention provides a polycrystalline layer in a thin film transistor using the technique of patterned crystallization with the assistance of metal impurities.

BACKGROUND OF THE INVENTION

To obtain high quality flat panel displays, active-matrix driving technology is needed. This includes liquid crystal displays (LCDs) and organic light emitting diodes (OLEDs). Active matrix driving allows full color realization and high resolution without cross-talk. The key technology of active-matrix driving display involves the fabrication of thin film transistors (TFTs) on a substrate, which is usually glass.

In conventional active matrix displays, TFTs are formed by amorphous silicon (a-Si), due to its low processing temperature and low manufacturing cost on large area glass substrates. However, it has been difficult to use the amorphous silicon TFT for advanced applications such as liquid crystal displays having very high resolution. For lower power consumption, and more compact structure, polycrystalline Si (poly-Si) is needed. In particular, if the polycrystalline silicon is formed at low temperature, peripheral driving circuits can be fabricated on the glass substrate as well. Thus, low temperature polycrystalline silicon (LTPS) may be a key technology to the future of the display market.

Presently, the techniques mainly used to crystallize a-Si to poly-Si are excimer laser crystallization (ELC), which irradiates the a-Si film with strong energy, or with nickel induced crystallization of amorphous silicon. The latter seems promising to produce poly-Si over large areas of glass substrate at low cost.

To realize this possibility, the technique of nickel induced crystallization of amorphous silicon has to meet the following requirements: (1) a low concentration of nickel after processing, (2) no alignment misplacement caused by the shrinkage of the glass substrate during the crystallization process, and (3) reduction of crystallization time to 2-3 hours. There appears to be no presently available technique that can fully satisfy these requirements. Therefore, it is an object of the present invention to use arranged continuous grain metal-induced lateral crystallized polycrystalline silicon film technology to meet the three requirements set forth above.

U.S. Pat. No. 5,705,829 (Miyanaga) discloses semiconductor device using a crystalline semiconductor film. The crystalline semiconductor film is formed by providing an amorphous silicon film with a catalyst metal for promoting crystallization thereof, and then heating to effect a thermal crystallization, following which the crystallized film is further exposed to laser light to improve the crystallinity.

U.S. Published Patent Application No. 2003/0129853 (Naoto) discloses a method for producing a thin film transistor, wherein after an amorphous silicon film is formed on a substrate, a nickel silicide layer is formed by spin coating with a solution nickel acetate solution that promotes the crystallization of silicon. The nickel silicide layer is selectively patterned to form island-like nickel silicide layers.

U.S. Pat. No. 6,737,674 (Zhang) discusses a method for eliminating influence of elemental nickel from a crystal silicon film obtained by utilizing nickel. A mask made of a silicon oxide film is formed on an amorphous silicon film. Then, the elemental nickel is held selectively on the surface of the amorphous silicon film by utilizing the mask. Next, a heat treatment is implemented to grow crystals. This crystal growth occurs with the diffusion of the nickel. Next, phosphorus is doped to a region by using the mask. Then, another heat treatment to removes the nickel from the pattern under the mask. After that, the silicon film is patterned by utilizing the mask again to form a pattern.

U.S. Pat. No. 6,338,991 (Zhang) relates to a method for manufacturing a semiconductor device such as a thin film transistor using a crystal silicon film. The crystal silicon film is obtained by selectively forming films, particles or clusters containing nickel, iron, cobalt, ruthenium, rhodium, palladium, osmium, iridium, platinum, scandium, titanium, vanadium, chromium, manganese, copper, zinc, gold, silver or a silicide thereof in a form of island, line, stripe, dot or film on or under an amorphous silicon film and using them as a starting point, by advancing its crystallization by annealing at a temperature lower than a normal crystallization temperature of an amorphous silicon.

U.S. Pat. No. 6,242,779 (Masashi) relates to a method for annealing amorphous silicon film to produce polycrystalline film suitable for thin-film transistors fabricated on glass substrates. The method involves using the selective location of nickel on a predetermined region of silicon to define the pattern of the lateral growth front as the silicon is crystallized. The method defines the resistivity of the silicide formed. The method also defines a specific range of nickel thicknesses to form the nickel silicide. A minimum thickness ensures that a continuous layer of nickel silicide exists on the growth front to promote an isotropic lateral growth front to form a crystalline film having high electron mobility, while a maximum thickness limit reduces the risk of nickel silicide enclaves in the crystalline film to degrade the leakage current.

SUMMARY OF THE INVENTION

The invention provides a method of forming a polycrystalline silicon film comprising depositing a first layer of amorphous silicon thin film on a substrate; forming a second layer of thin film on the first layer of amorphous silicon thin film; patterning the second layer of thin film so that the first layer of amorphous silicon thin film is exposed at selected locations; depositing a thin layer of a nickel containing compound on the exposed selected locations on the first amorphous silicon thin film; removing the second layer of thin film; and annealing the resulting composite layer of thin film at a sufficient temperature to convert the first layer of amorphous silicon thin film into polycrystalline silicon.

The invention further provides method of forming a polycrystalline silicon film comprising depositing a first layer of amorphous silicon thin film on a substrate; forming a second layer of thin silicon oxide film on the first layer; patterning the second layer of thin silicon oxide film to expose selected areas on the first layer; forming a thin native silicon oxide layer on the exposed selected areas of the first layer; depositing a thin layer of a nickel containing compound on the second layer of silicon oxide and the thin layer of native silicon oxide to form a resulting composite layer; and annealing the resulting composite layer at a sufficient temperature to covert first layer into polycrystalline silicon.

The invention further provides a method of forming an array of thin film transistors, comprising forming a continuous layer of polycrystalline silicon thin film on a substrate; patterning the continuous layer of polycrystalline silicon thin film into an array of active channels; providing source, drain, and gate connections to the active channels; and providing interconnections to the source, drain and gate connections to form an array of thin film transistors.

BRIEF DESCRIPTION OF THE DRAWINGS

Further features and advantages of the invention may be understood by reviewing the following detailed description of the preferred embodiments taken in conjunction with the accompanying drawings in which.

DETAILED DESCRIPTION OF THE PREFERRED EMBODIMENTS

Figure 1:
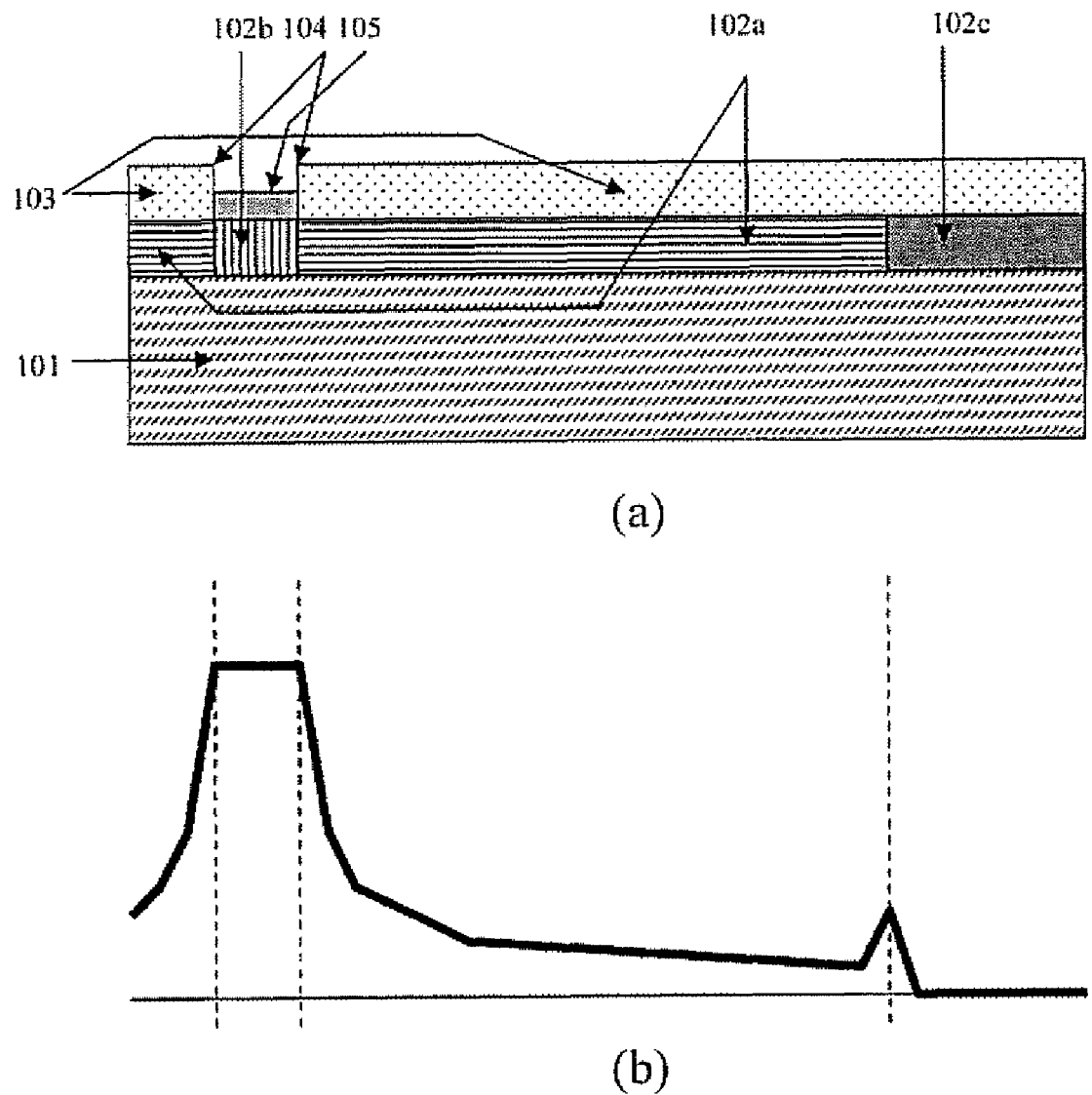
FIGS. 1a and 1b are schematic drawings of the MILC process and the nickel distribution of the poly-Si crystallized using the induced hole.

As shown in FIG. 1a, low temperature oxide (LTO) 103 is formed on an amorphous silicon film provided on substrate 101. The induced hole 104 is opened in a selected area in the LTO, and the nickel-containing layer 105 is formed on it. The sample is then annealed at 500-600° C. in a nitrogen atmosphere for several hours. At the same time, the metal induced crystallization area 102a, the metal induced lateral crystallization area 102b, and the non-crystallized area 102c are formed. As shown in FIG. 1b, the poly-Si near to induced hole contains a lot of nickel and cannot be used as active layer of TFT. So the high quality MILC area is only located in some appointed regions. Although the selected high quality MILC poly-Si film is suitable for TFTs with high electron mobility and low leakage current, alignment misplacement caused by the shrinkage of the substrate during the crystallization and the nickel gettering process is still not resolved. The present invention provides a method to obtain continuous grain poly-Si film, eliminating the area with high nickel concentration. The high quality poly-Si suitable for TFT can be obtained and the active layer can be defined after the crystallization of a-Si. Meanwhile, the alignment misplacement caused by the shrinkage of the glass substrate during the crystallization process also can be avoided.

Figure 2A:
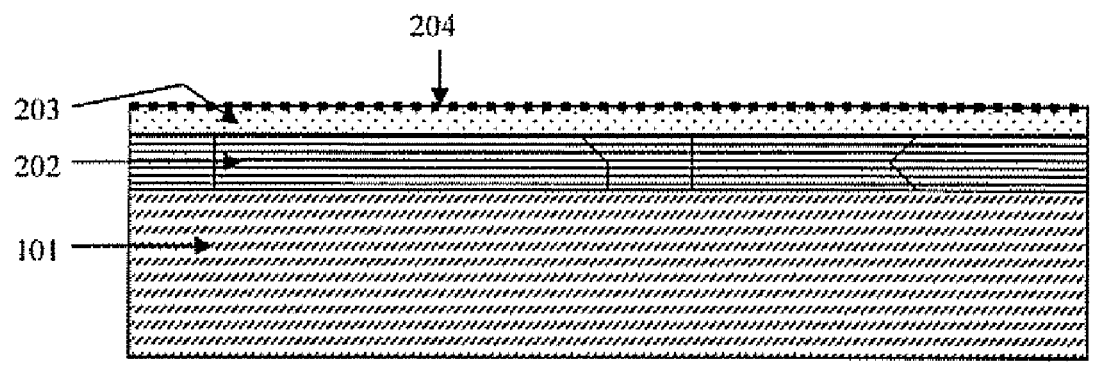
FIGS. 2a and 2b are schematic drawings of disk-like MILC Poly-Si process, where silicon nitride is used as the cover layer.
Figure 2B:
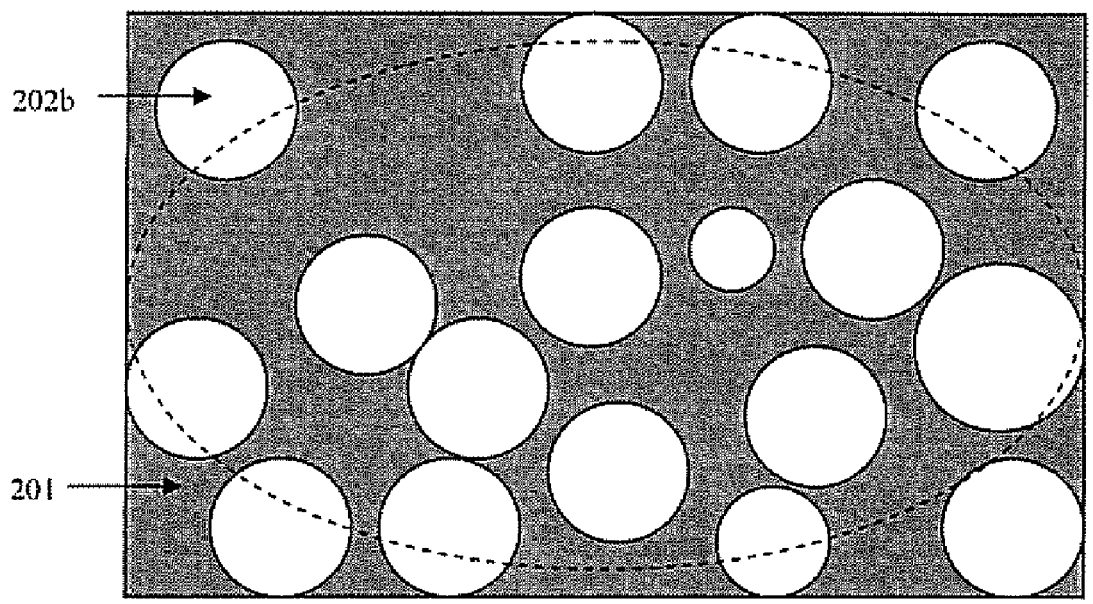

As shown in FIG. 2a, silicon nitride 203 used as cover layer is formed on an amorphous silicon film provided on a substrate 101. Then a tiny of nickel 205 is covered on it. The sample was then annealed at 500-600° C. in a nitrogen atmosphere for several hours, and the a-Si changed to MILC poly-Si 202 composed of disk-like grains. Applying this technique, we can obtain continuous grain high quality MILC poly-Si film, which is suitable for a TFT active layer, while avoiding the alignment misplacement caused by the shrinkage of the glass substrate during the crystallization process. However, as shown in FIG. 2b, the random distribution of crystallization nuclei 202b in the a-Si film results in a lack of control over the time of crystallization and the reproducibility of the process.

FIGS. 3 to 10 show the key techniques in the poly-Si formation process, the design of typical micro-structure and the results of the material using therefore in the present invention. As shown in FIG. 3a, 30 nm to 300 nm amorphous silicon film 301 is deposited on the glass substrate 101, which is covered by silicon nitride and silicon oxide as a buffer layer. 0.5-2 μm photoresist 302 is spin coated onto the a-Si surface. Then, the crystalline nucleation sites 303 (where the crystalline nucleus formed) and the nickel supplementary sites 304 are defined. The nickel supplementary sites are squares in size of 2 μm×2 μm to 4 μm×4 μm or circles or some other shape else having the same area. The nuclei localization holes are larger than the nickel supplementary holes.

After a hard bake, the samples are dipped into 1% HF to etch the native oxide in sites 303, 304. They are then washed by deonized water and immersed into a nickel salt solution such as a nickel acetate solution with a pH value of 8, and a concentration of 10-1000 ppm (needs to be regulated) for 10-30 minutes. A small quantity of nickel or nickel oxide 305 adheres to the a-Si surface in sites 303 and 304. Then the photoresist 302 is stripped by organic solution. The nickel quantity adhered to the a-Si surface must be matched to the size of the crystalline nucleation sites and the nickel supplementary sites, so that metal induced lateral crystallization occurs just in the crystalline nucleation sites and not in the nickel supplementary sites.

Figure 3A:
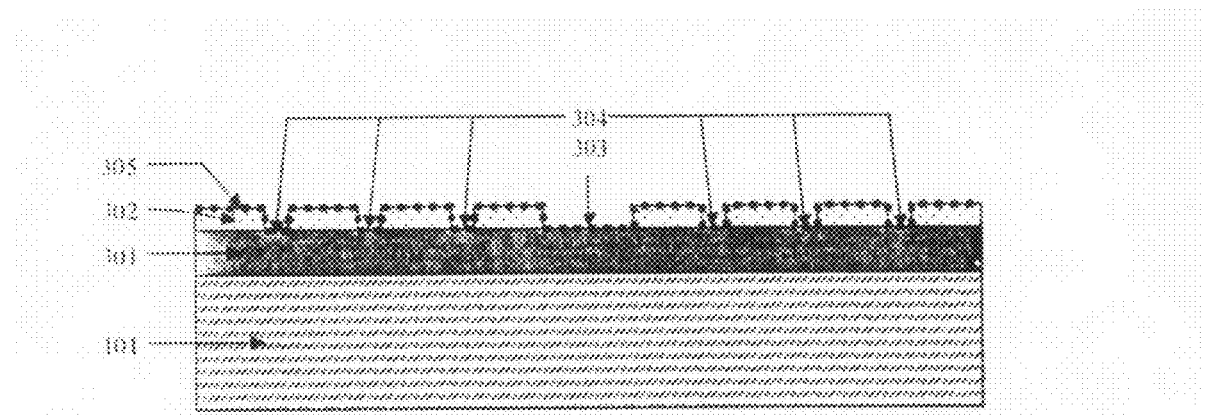
FIGS. 3a-c are schematic drawings of the MILC process and the distribution of nickel.
Figure 3B:
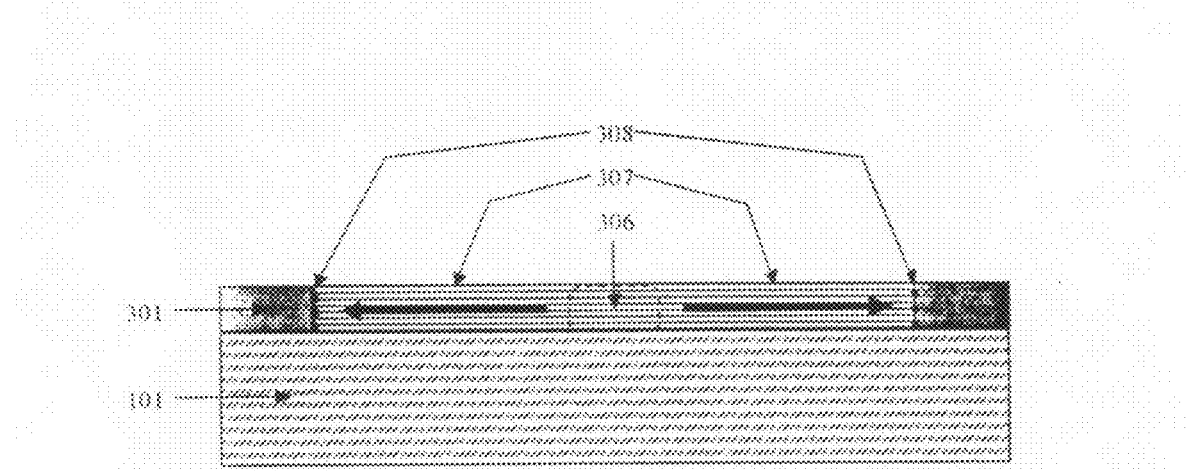
Figure 3C:
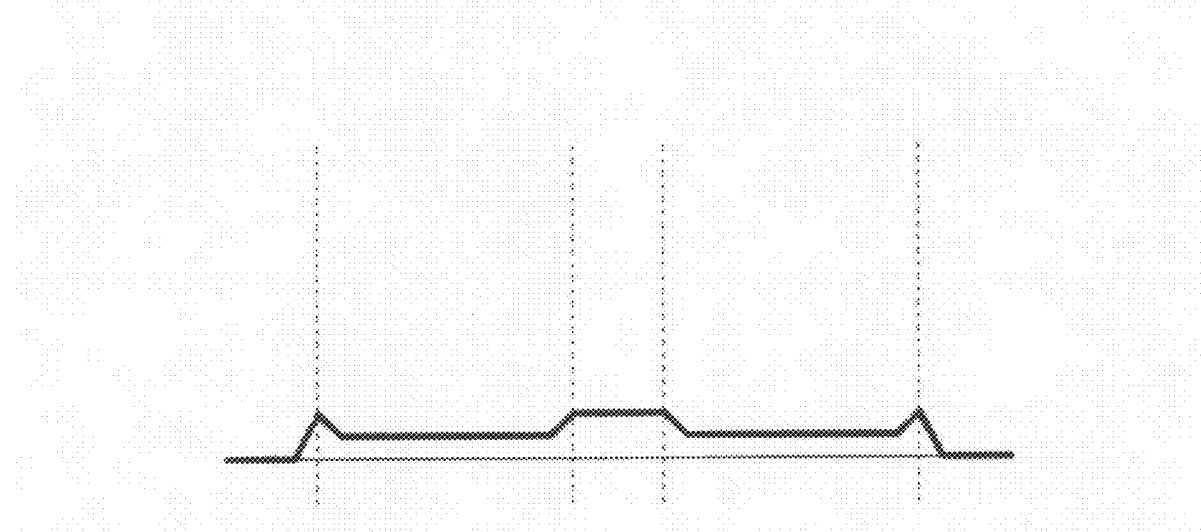

As shown in FIG. 3b, the samples are cleaned by deonized water, then dried by a spin-dryer, and annealed at 550-590° C. for 2-4 hours in an $N_2$ atmosphere. During the annealing process, the region in the crystalline nucleation sites turns into an incubation area 306, where a critical density of nickel, which can cause metal induced lateral crystallization, is reached. The metal induced lateral crystallization begins from the incubation area 306. The nickel consumed during the crystallization process in the crystallization front-end is supplied by nickel in the nickel supplementary sites 304 not by the nickel diffused from the crystalline nucleation sites 303. Flight quality continuous grain poly-Si films 307 are obtained. As shown in FIG. 3c, the nickel density in the crystalline nucleation sites is obviously reduced compared to the conventional MILC.

Figure 4:
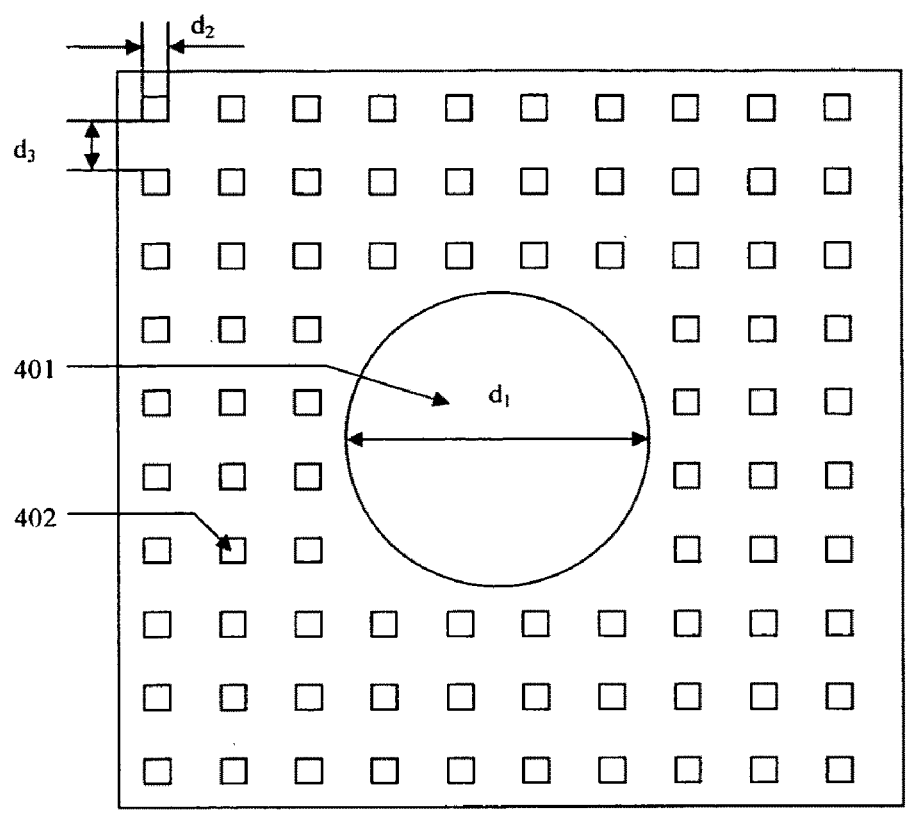
FIG. 4 is a schematic drawing of the crystalline nucleation sites and the nickel supplementary sites to result in the disk-like grain MILC poly-Si.

FIG. 4 shows a schematic drawing of the crystalline nucleation sites and the nickel supplementary sites used to create the disk-like grain MILC poly-Si. The crystalline nucleation sites are circles 401 with a diameter of d1, which is from 10-30 μm, This is determined by the ratio of the crystalline nucleation sites to grain size, the localized function, and the nickel density. The nickel supplementary holes 402 are square, and have a size of 2 μm×2 μm to 4 μm×4 μm, which is so little that there is not enough nickel to induce lateral crystallization. The ratio of size of nickel supplementary sites d1 to the distance between the holes d2 is 1/2 to 1/4, The ratio of area of all of the holes to the crystallized film is 1/4 to 1/16.

Figure 5:
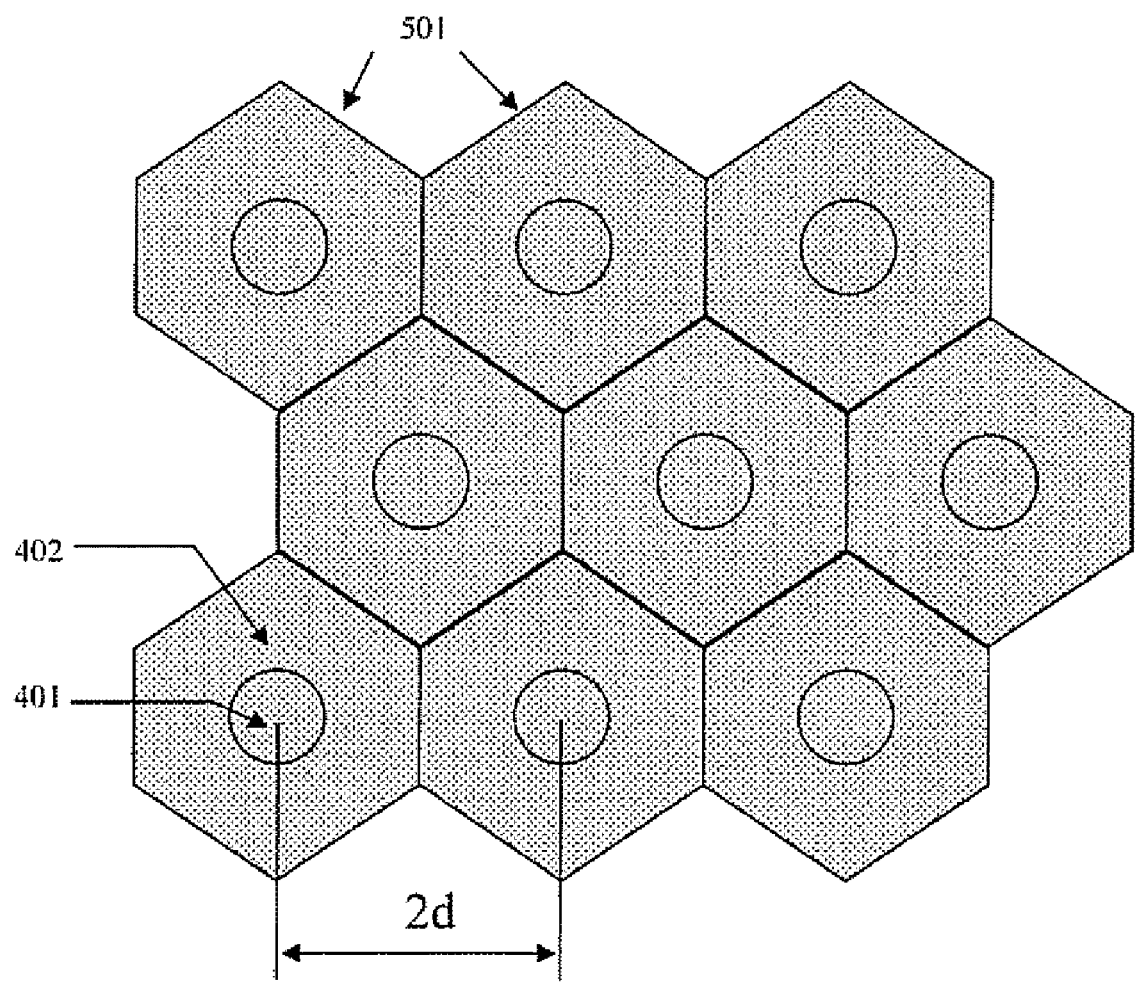
FIG. 5 is a schematic drawing of the disk-like grain arranged to honeycomb grain.
Figure 6:
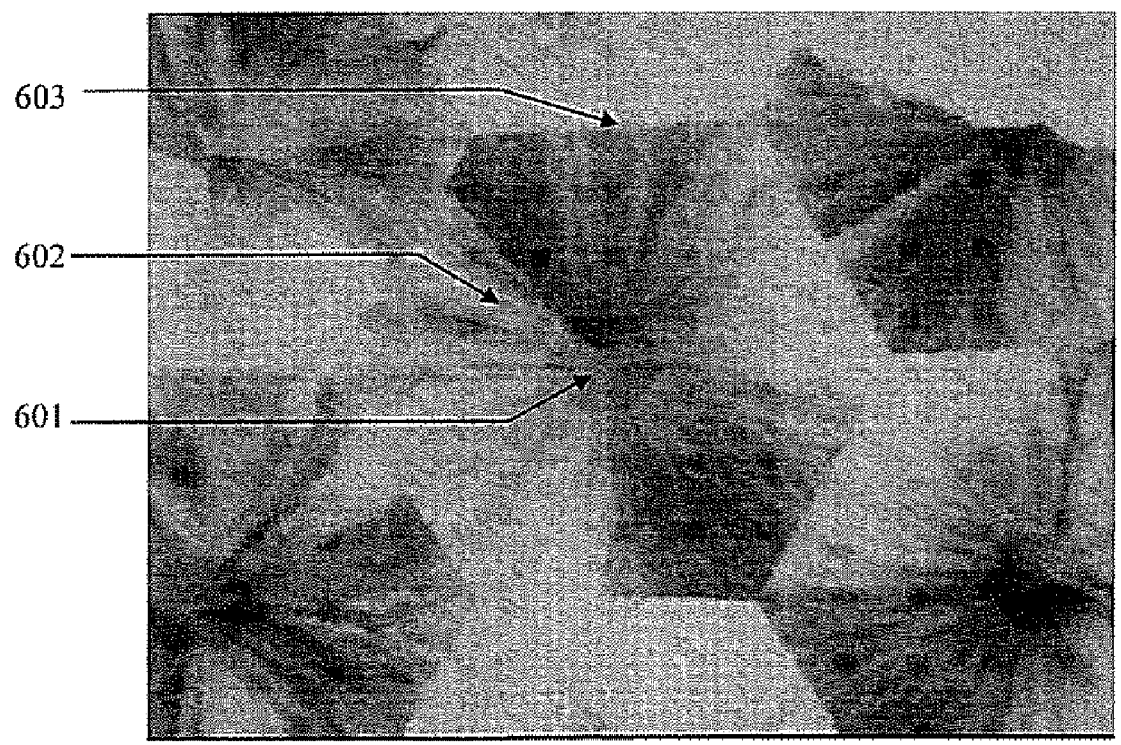
FIG. 6 is a photomicrograph of the poly-Si with honeycomb grain etched with TMAH.

The different arrangement of the crystalline nucleation sites can result in different shape and size of the grain. The typical disk-like grain is shown in FIG. 5 where the crystalline nucleation sites 401 are arranged according to an equilateral triangle. The continuous hexagonal MILC grain 501 is formed, which is defined as honeycomb grain.

Because of the etching selectivity of the TMAH etchant between different crystalline orientations, the etched poly-Si composed of honeycomb grain by TMAH at room temperature shows the inside structure of the films. Morphologies of MILC poly-Si are studied with a microscope and shown in the photomicrographs of FIG. 6. The disk-like grain MILC poly-Si 601 is formed in the 20 μm crystalline nucleation sites. During the annealing process, the grain extends in the radial orientation 602, until the neighboring MILC grains fronts collide and the grain boundaries 603 form. All the disk-like MILC grain compose the continuous MILC poly-Si films. The poly-Si in the nickel supplementary holes has the same orientation to the entire grain, which proves that there is no crystalline nucleus formed.

Figure 7:
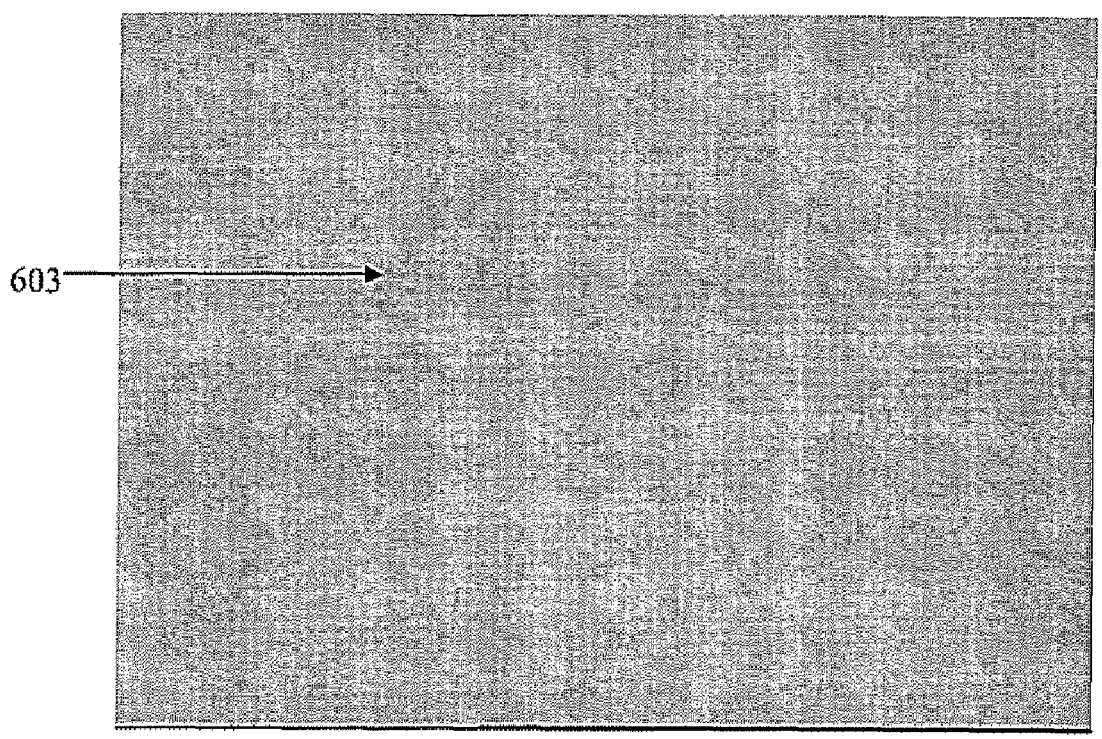
FIG. 7 is a photomicrograph of the poly-Si with honeycomb grain etched with Secco.

FIG. 7 shows photomicrographs or poly-Si composed of honeycomb grain etched with Secco. The hexagonal grain boundary only exists in the boundary area of grain 603, and not inside the grain, which also shows that the MILC poly-Si is continuous inside the grain.

Figure 8:
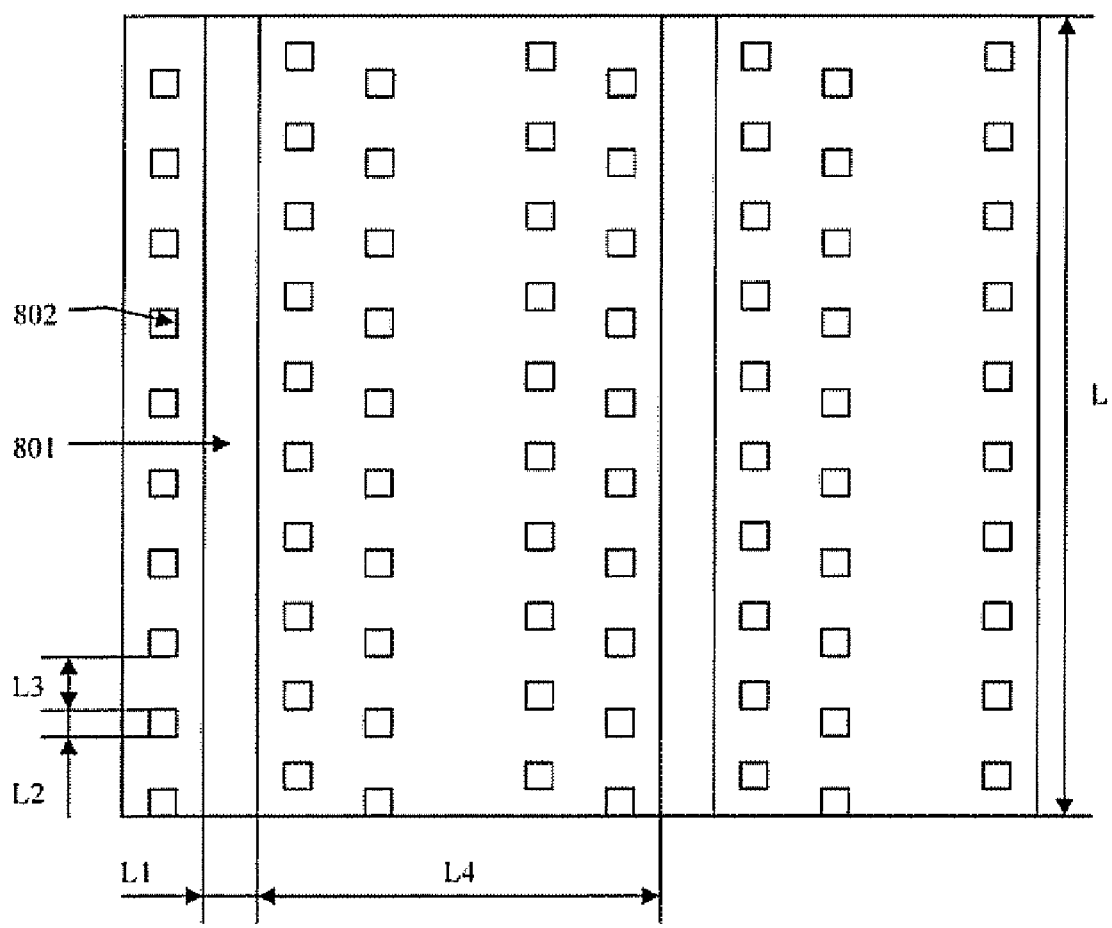
FIG. 8 is a schematic drawing of the crystalline nucleation sites and the nickel supplementary sites to result in the MILC poly-Si with parallel line structure grains.
Figure 9:
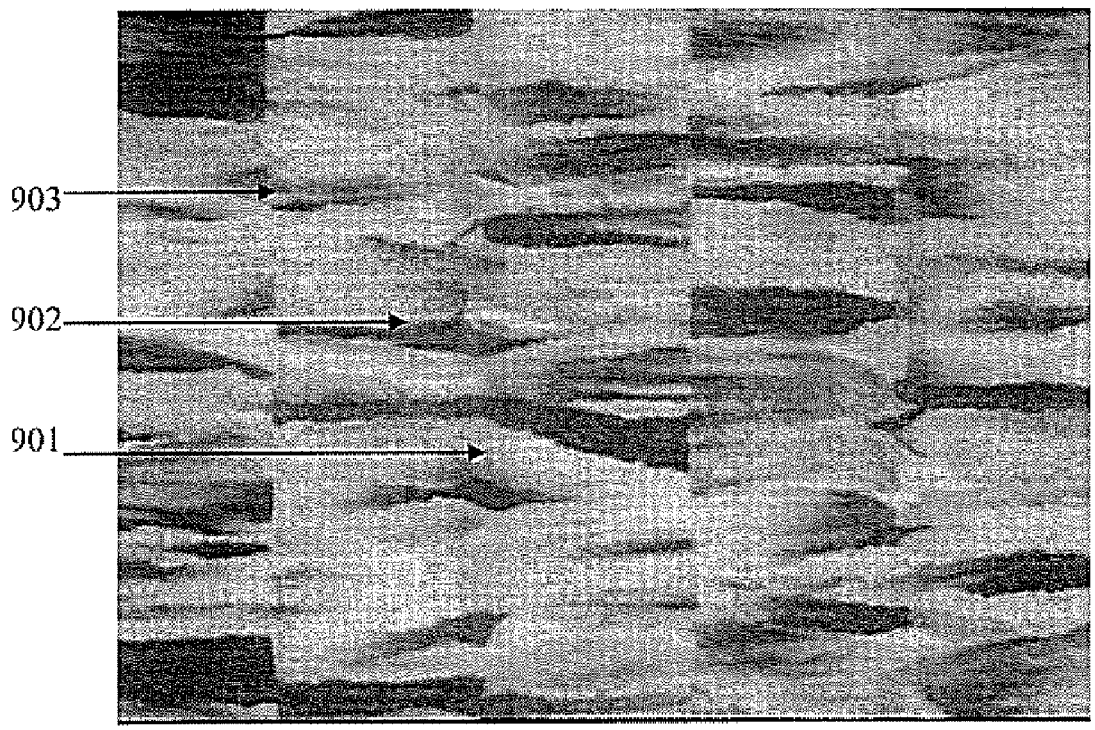
FIG. 9 is a photomicrograph of the parallel line structure of poly-Si etched by TMAH.

Another important kind of MILC poly-Si film has parallel line structure. FIG. 8 is a schematic plan-view of the crystalline nucleation sites and the nickel supplementary sites used to result in the MILC poly-Si composed of parallel line structure grains. The crystalline nucleation sites are rectangles, in which the length of the longer side is the saline as the amorphous silicon substrate, from tens of centimeters to several meters. The width of the rectangles is L1, from 5-10 μm, which is determined by the ratio of the crystalline nucleation sites to grain size, the localization function and the nickel density. The nickel supplementary sites 402 are squares of 2 μm×2 μm to 4 μm×4 μm, in which there is insufficient nickel to induce lateral crystallization. The nickel supplementary sites in neighboring lines are staggered to each other, so that the nickel can be uniformly supplied. There is no nickel supplementary site in the middle of the two crystalline nucleation sites. The ratio of size of nickel supplementary sites d1 to the distance between the holes d2 is from 1/4 to 1/4 . The ratio of area of all the sites to the crystallized film is from 1/4 to 1/16.

Because of the etching selectivity of TMAH etchant between different crystalline orientations, the poly-Si composed of parallel line structure grains etched by TMAH at room temperature shows the inside structure of the films. Morphologies of MILC poly-Si are studied with the microscope and shown in FIG. 9. The disk-like grain MILC poly-Si 601 is formed in the 8 μm crystalline nucleation sites. Then, during the annealing process, the grain extends in the semi-parallel direction 602, until fronts of the neighboring MILC grains collide and the grain boundaries 603 formed. All the parallel line MILC grains compose to the continuous MILC poly-Si films. The poly-Si in the nickel supplementary sites has the same orientation as the entire grain, which proves that there is no crystalline nucleus formed alone.

Figure 10:
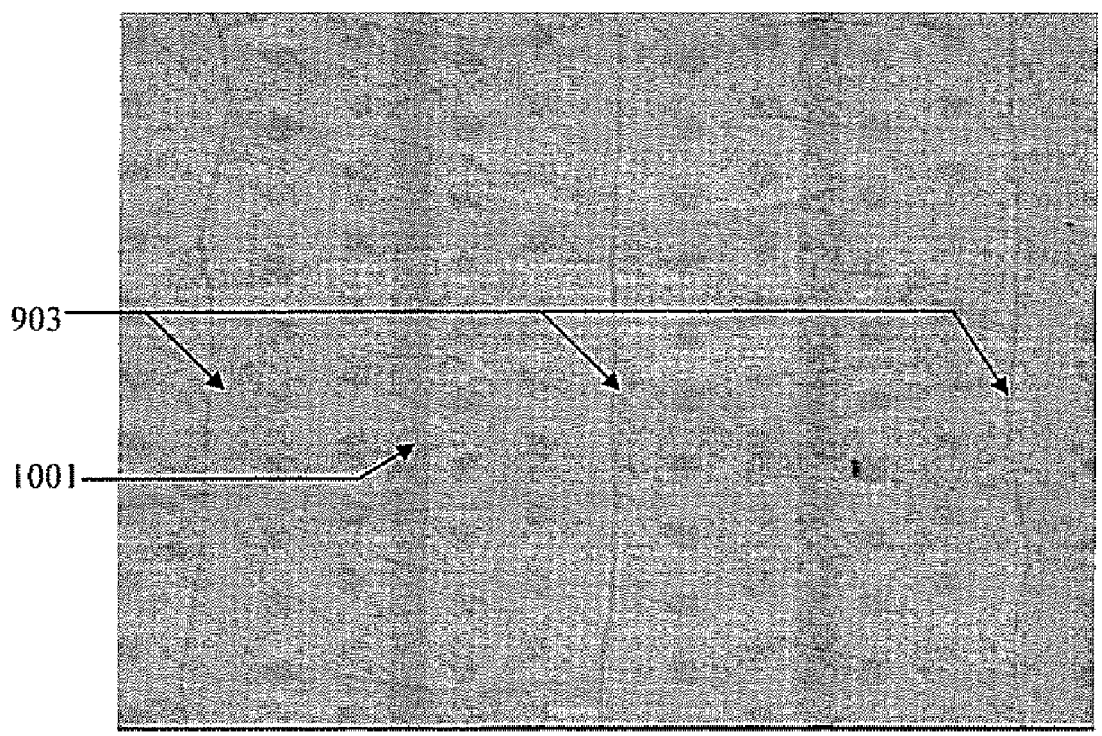
FIG. 10 is a photomicrograph of the parallel line structure of poly-Si etched by Secco.

FIG. 10 includes photomicrographs of the poly-Si composed of parallel line grains etched with Secco. The linear grain boundaries are formed in the grain collide area 903. Meanwhile, some grain boundaries between the disk-like grains are formed in the crystalline nucleation sites, and disappeared after the grain extends a certain length, finally, become to continuous grain MILC poly-Si.

This is the present invention provides a method of forming high quality LTPS film, using metal induced crystallization. It is novel in several aspects and in the combination thereof: (1) the nickel is provided by a solution process directly on exposed a-Si; (2) the nucleation sites are patterned; and (3) supplemental sites between the nucleation sites furnish additional nickel, which is consumed during the crystallization process. The nickel consumed during crystallization can be replenished by the nickel in the nickel supplementary sites distributed on the a-Si surface. The method does not depend on the nickel diffused from the crystalline nucleation sites. As a result, there is no area on the crystallized poly-Si that will contain a high concentration of nickel. The entire poly-Si film can be available for the active layer in the TFT.

With the combination of solution processing, the provision of the crystalline nucleation sites, and the nickel supplementary sites, the poly-Si film obtained will have continuous grains. The entire film is usable for making TFT regardless of the position of the grain boundaries. Such problems as alignment misplacement caused by the irreversible shrinkage and warping on the substrate during heat treatment can be eliminated. There is an optimal placement of the crystalline nucleation sites and the nickel supplementary sites and they are part of this invention. Among the optimal designs are a honeycomb structure and a parallel lines structure. This process is precisely controllable. The crystallization time is reduced as well, compared to conventional MIC.

While the invention has been described by reference to certain preferred embodiments, it should be apparent from reviewing this disclosure that many variations and modifications of the invention can be made by a person or ordinary skill in the art without departing from the spirit and scope thereof. It is therefore intended that the invention be defined by the following claims.

All references referred to herein including articles, patents, and patent applications are incorporated herein by reference.

We claim:

1. A method of forming a polycrystalline silicon film comprising the steps:
   depositing a first layer of amorphous silicon thin film on a substrate;
   forming a second layer of thin film on the first layer of amorphous silicon thin film;
   patterning the second layer of thin film so that the first layer of amorphous silicon thin film is exposed at selected locations to expose major and minor areas of the first layer, and wherein the second layer is removed when the second layer is organic;
   depositing a thin layer of a nickel containing compound on the exposed selected locations on the first amorphous silicon thin film;
   removing the second layer of thin film;
   forming a native silicon oxide layer on exposed locations of the first layer of amorphous silicon thin film; and
   annealing the resulting composite layer of thin film at a sufficient temperature to convert the first layer of amorphous silicon thin film into polycrystalline silicon.

2. A method according to claim 1, additionally comprising forming a native silicon oxide layer on the exposed locations on the first layer of amorphous silicon thin film.

3. A method according to with claim 1, wherein the substrate is glass.

4. A method according to claim 1, wherein the first layer is formed by PECVD, LPCVD ora sputtering process.

5. A method according to with claim 4, wherein the first layer has a thickness that ranges from about 10 nm to about 300 nm.

6. A method according to with claim 1, wherein the second layer is a photoresist or silicon oxide.

7. A method according to with claim 6, wherein the second layer of silicon oxide has a thickness of about 2 nm to about 10 nm.

8. A method according to claim 1 wherein the native silicon oxide layer thickness has a range from about 0 to about 4 nm.

9. A method according to claim 8, wherein patterning the second layer of thin film is performed by photolithography.

10. A method according to claim 1, wherein the pattern in the second layer is a series of circular holes with diameters ranging from about 2 to about 30 microns arranged in a square lattice.

11. A method according to claim 1, wherein the pattern of the second layer is a series of circular holes with diameters ranging from about 2 to about 30 microns arranged in a hexagonal lattice.

12. A method according to claim 1, wherein the pattern of the second layer is a series of long parallel strips having widths ranging from about 0.5 to about 10 microns, and the distance between the strips is about 10 to about 90 microns.

13. A method according to claim 1, wherein the pattern of the major areas of the second layer Is a series of circular holes having diameters ranging from about 2 to about 30 microns arranged in a square lattice.

14. A method according to claim 1, wherein the pattern of the major areas of the second layer is a series of circular holes with diameters ranging from about 2 to about 30 microns arranged in a hexagonal lattice.

15. A method according to claim 1, wherein the pattern of the major areas of the second layer is a series of long parallel strips with widths ranging from 0.5 to 10 microns, and wherein the distance between the strips is about 10 to about 90 microns.

16. A method according to claim 1, wherein the pattern of the minor areas of the second layer is a series of circular holes with a diameter ranging from about 0 to about 8 microns, arranged in a square lattice, and wherein the holes have spacing of about 2 to about 10 microns between the major areas.

17. A method according to claim 1, wherein the pattern of the minor areas of the second layer is a series of circular holes having diameters ranging from about 0 to about 8 microns arranged In a hexagonal lattice, and wherein the holes have spacing of about 2 to about 10 microns between the major areas.

18. A method according to claim 1, wherein depositing a nickel containing compound includes immersing the first amorphous silicon thin film layer into a solution containing the nickel containing compound.

19. A method according to claim 1, wherein depositing the nickel containing compound is performed by sputtering or evaporation coating of nickel in a vacuum.

20. A method according to claim 1, wherein depositing the nickel containing compound is performed by spin coating a nickel containing compound in air.

21. A method according to claim 1, wherein depositing the nickel containing compound is performed by ion implantation in a vacuum.

22. A method according to claim 1, wherein annealing is carried out in a nitrogen atmosphere.

23. A method according to claim 1, wherein annealing is carried out at a temperature between about 450° C. to about 650° C.

24. A thin film transistor device comprising one or more polycrystalline thin films made in according to the method of claim 1.

25. A method of forming a polycrystalline silicon film comprising:
    depositing a first layer of amorphous silicon thin film on a substrate;
    forming of a second layer of thin silicon oxide film on the layer;
    patterning the second layer of thin silicon oxide film to expose selected major and minor areas of the first layer;
    forming a thin native silicon oxide layer on the exposed major and minor areas of the layer;
    depositing a thin layer of a nickel containing compound on the second layer of silicon oxide and the thin layer of native silicon oxide to form a resulting composite layer; and
    annealing the resulting composite layer at a sufficient temperature to convert the first layer into polycrystalline silicon.

* * * * *